(12) United States Patent
Green et al.

(10) Patent No.: US 9,818,585 B2
(45) Date of Patent: Nov. 14, 2017

(54) IN SITU PLASMA CLEAN FOR REMOVAL OF RESIDUE FROM PEDESTAL SURFACE WITHOUT BREAKING VACUUM

(71) Applicant: Applied Materials, Inc., Santa Clara, CA (US)

(72) Inventors: Richard J. Green, Tracy, CA (US); Cheng-Hsiung Tsai, Cupertino, CA (US); Shambhu N. Roy, San Jose, CA (US); Puneet Bajaj, Bangalore (IN); David H. Loo, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 191 days.

(21) Appl. No.: 14/280,201

(22) Filed: May 16, 2014

(65) Prior Publication Data
US 2014/0366912 A1 Dec. 18, 2014

Related U.S. Application Data

(63) Continuation of application No. 12/706,484, filed on Feb. 16, 2010, now Pat. No. 8,900,471.
(Continued)

(51) Int. Cl.
*C23C 14/34* (2006.01)
*H01J 37/32* (2006.01)
(Continued)

(52) U.S. Cl.
CPC ........ *H01J 37/32862* (2013.01); *C23C 14/50* (2013.01); *C23C 14/564* (2013.01);
(Continued)

(58) Field of Classification Search
CPC ................... H01J 37/32715; H01J 37/32642
See application file for complete search history.

(56) References Cited

U.S. PATENT DOCUMENTS

| 5,403,459 A | 4/1995 | Guo |
| 5,549,802 A | 8/1996 | Guo |

(Continued)

FOREIGN PATENT DOCUMENTS

| CN | 101083223 | 12/2007 |
| JP | AH6224139 | 8/1994 |

(Continued)

OTHER PUBLICATIONS

Non-final Office Action for U.S. Appl. No. 12/706,484 dated May 8, 2013.
(Continued)

*Primary Examiner* — Jason M Berman
(74) *Attorney, Agent, or Firm* — Patterson + Sheridan, LLP

(57) ABSTRACT

Methods and apparatus for in-situ plasma cleaning of a deposition chamber are provided. In one embodiment a method for plasma cleaning a deposition chamber without breaking vacuum is provided. The method comprises positioning a substrate on a susceptor disposed in the chamber and circumscribed by an electrically floating deposition ring, depositing a metal film on the substrate and the deposition ring in the chamber, grounding the metal film deposited on the deposition ring without breaking vacuum, and removing contaminants from the chamber with a plasma formed in the chamber without resputtering the metal film on the grounded deposition ring and without breaking vacuum.

20 Claims, 5 Drawing Sheets

Related U.S. Application Data

(60) Provisional application No. 61/156,258, filed on Feb. 27, 2009.

(51) Int. Cl.
*C23C 14/50* (2006.01)
*C23C 14/56* (2006.01)
*H01J 37/34* (2006.01)

(52) U.S. Cl.
CPC .. *H01J 37/32642* (2013.01); *H01J 37/32715* (2013.01); *H01J 37/3408* (2013.01)

(56) References Cited

U.S. PATENT DOCUMENTS

| | | |
|---|---|---|
| 5,589,224 A | 12/1996 | Tepman et al. |
| 5,630,917 A | 5/1997 | Guo |
| 5,632,873 A * | 5/1997 | Stevens .................. C23C 14/50 118/503 |
| 5,788,778 A | 8/1998 | Shang et al. |
| 5,865,896 A | 2/1999 | Nowak et al. |
| 5,902,403 A | 5/1999 | Aitani et al. |
| 6,099,697 A | 8/2000 | Hausmann |
| 6,187,682 B1 | 2/2001 | Denning et al. |
| 6,192,898 B1 | 2/2001 | Aitani et al. |
| 6,217,721 B1 | 4/2001 | Xu et al. |
| 6,395,157 B2 | 5/2002 | Khurana et al. |
| 6,776,170 B2 | 8/2004 | Liu |
| 6,843,858 B2 | 1/2005 | Rossman |
| 8,012,306 B2 | 9/2011 | Dhindsa |
| 9,127,362 B2 | 9/2015 | Scheible et al. |
| 2003/0029715 A1 | 2/2003 | Yu et al. |
| 2007/0102286 A1 | 5/2007 | Scheible et al. |
| 2007/0186855 A1* | 8/2007 | Dhindsa ............ H01J 37/32082 118/723 E |
| 2007/0209931 A1 | 9/2007 | Miller |
| 2007/0283884 A1 | 12/2007 | Tiller et al. |
| 2008/0178801 A1 | 7/2008 | Pavloff et al. |
| 2009/0242383 A1* | 10/2009 | Vukovic ................. C23C 14/50 204/164 |
| 2009/0260982 A1 | 10/2009 | Riker et al. |
| 2009/0272647 A1 | 11/2009 | Young et al. |

FOREIGN PATENT DOCUMENTS

| | | |
|---|---|---|
| JP | AH6346223 | 12/1994 |
| JP | AH113878 | 1/1999 |
| JP | 2002-222799 | 8/2002 |
| JP | 2007146290 A | 6/2007 |
| JP | A2007321244 A | 12/2007 |
| JP | T2009527128 A | 7/2009 |
| WO | 2008079722 A2 | 7/2008 |

OTHER PUBLICATIONS

Final Office Action for U.S. Appl. No. 12/706,484 dated Dec. 18, 2013.
Notice of Allowance for U.S. Appl. No. 12/706,484 dated Jun. 16, 2014.
Notice of Grant for Chinese Application No. 201080018337.5 dated Oct. 29, 2013.
Office Action for Japanese Application No. 2011-552068 dated Dec. 24, 2013.
International Preliminary Report on Patentability for International Application No. PCT/US10/24404 dated Sep. 9, 2011.
Office Action and Search Report for Taiwanese Application No. 99105714 dated Jun. 24, 2014.
PCT International Search Report and Written Opinion dated Jun. 7, 2010 for International Application No. PCT/US2010/024404.
First Office Action dated Feb. 17, 2013 for Chinese Patent Application No. 201080018337.5.
Office Action for Korean Application No. 10-2016-7014208 dated Jul. 25, 2016.

* cited by examiner

IN SITU PLASMA CLEAN FOR REMOVAL OF RESIDUE FROM PEDESTAL SURFACE WITHOUT BREAKING VACUUM

CROSS-REFERENCE TO RELATED APPLICATIONS

This application is a continuation of co-pending U.S. patent application Ser. No. 12/706,484, filed Feb. 16, 2010, which claims benefit of U.S. Provisional Patent Application Ser. No. 61/156,258, filed Feb. 27, 2009, both of which are herein incorporated by reference in their entirety.

BACKGROUND OF THE INVENTION

Field of the Invention

Embodiments described herein generally include an apparatus for plasma cleaning and a method for plasma cleaning.

Description of the Related Art

Physical vapor deposition (PVD) is a method of depositing a material onto a substrate. A PVD chamber may have a sputtering target disposed within a processing chamber and situated opposite a substrate. A sputtering gas, such as argon, is introduced into the chamber. The sputtering target, when metallic, may be electrically biased with a DC current to ignite the argon gas into a plasma. The substrate, on the other hand, may be grounded to act as an anode relative to the electrically biased sputtering target. Atoms from the sputtering target may eject or sputter from the sputtering target and deposit a metal film on the substrate.

While the atoms from the sputtering target may deposit onto the substrate, the atoms may also deposit on exposed surfaces within the chamber. For example, material may be deposited on the chamber walls and other chamber components including deposition rings. Over time, the material deposited onto the chamber walls and components may build up to a sufficient thickness that the chamber needs to be cleaned.

Additionally, dielectric material and other organic residues may be deposited onto the substrate in other chambers. Whenever the chamber is opened to permit a substrate to enter and/or exit the chamber, dielectric material may enter into the chamber. The dielectric material may be present in other chambers and flow into the chamber where it may condense on the chamber surfaces, including the susceptor. If the susceptor is an electrostatic chuck and sufficient dielectric material builds up on the susceptor, the electrostatic charge of the susceptor, when biased, may be shielded by the dielectric material and prevent the substrate from being attracted to the susceptor. If there is sufficient dielectric material built up on the susceptor, the substrate may pop off of the susceptor due to insufficient electrostatic charge, possibly resulting in damage to the substrate and/or chamber components.

Plasma cleaning processes have been developed for removing dielectric material and other organic residues from chamber components such as the susceptor. However, when performing these plasma cleaning processes, the metallic material deposited on the chamber components including the deposition ring may be resputtered throughout the chamber including onto the surface of the susceptor thus rendering the susceptor unusable. Currently, due to the danger of resputtering metallic material, plasma cleaning processes are typically performed after venting the processing chamber and inserting a new deposition ring into the chamber. After metallic material is deposited on the deposition ring, the current plasma cleaning processes are generally not performed because of the danger of resputtering the metallic material throughout the chamber. However, as the amount of organic residues on substrates increases, the need to perform plasma cleaning processes concurrently increases, leading to an increase in processing chamber downtime due to the need to replace process kit components before the kit components have completed their expected life-cycle.

Therefore, there is a need for a plasma cleaning process that removes organic residues from chamber components while increasing chamber uptime.

SUMMARY OF THE INVENTION

Embodiments described herein generally include an apparatus for plasma cleaning and a method for plasma cleaning. In one embodiment, a method for plasma cleaning a deposition chamber component without breaking vacuum, comprising grounding a metal film deposited on a first chamber component disposed in a deposition chamber without breaking vacuum and removing contaminants from the chamber with a plasma formed in the chamber without resputtering the grounded metal film deposited on the first chamber component and without breaking vacuum.

In another embodiment a method for plasma cleaning a deposition chamber without breaking vacuum is provided. The method comprises positioning a substrate on a susceptor disposed in the chamber and circumscribed by an electrically floating deposition ring, depositing a metal film on the substrate and the deposition ring in the chamber, grounding the metal film deposited on the deposition ring without breaking vacuum, and removing contaminants from the chamber with a plasma formed in the chamber without resputtering the metal film on the grounded deposition ring and without breaking vacuum.

In yet another embodiment, a process kit for plasma cleaning of a Physical Vapor Deposition (PVD) chamber without breaking vacuum is provided. The process kit comprises an annular deposition ring having a boss extending from a top surface. The process kit further comprises a metallic connecting strap having a hole accepting the boss of the deposition ring, wherein an end of the strap is exposed on top of the deposition ring radially inward of the boss.

In yet another embodiment a physical vapor deposition (PVD) chamber is provided. The chamber comprises a sputtering target for depositing sputtered materials onto a substrate, a susceptor disposed generally parallel to and opposite the sputtering target for supporting a substrate, wherein the susceptor is movable between a processing position and a cleaning position, an electrically floating deposition ring encircling the susceptor, a grounded lift-pin plate positioned below the susceptor, a metallic connecting strap coupled to the deposition ring for electrically coupling metallic films deposited on the deposition ring with the grounded lift-pin plate, a grounding loop electrically coupled with the metallic connecting strap, the loop contacting the grounded lift-pin plate when the susceptor is in a cleaning position and spaced from the grounded lift pin plate when the susceptor is in the wafer processing position, a gas supply for introducing a gas into the chamber, and a gas exhaust for exhausting gas from the chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments describe herein generally include an apparatus for plasma cleaning and a method for plasma cleaning. Periodically, a PVD chamber may need to be cleaned to remove material that has built up in undesired locations within the chamber including chamber components. In order to use plasma to clean chamber components without venting the chamber some of the components that have target material disposed thereon are grounded to prevent resputtering of the target material from the components during cleaning. In one embodiment, a thin sheet of metallic material with a low chance of resputtering relative to the target material is brought into contact with the chamber component and electrical contact is established between the chamber component and the thin sheet of metallic material when a sufficient amount of target material has been deposited. Once electrical contact is established between the target material deposited on the chamber component and the thin sheet of metallic material, the deposited target material is grounded by moving the chamber parts into a grounding configuration and the plasma cleaning process commences. Thus by taking advantage of the movement of chamber parts to ground the target material deposited on chamber components, the chamber may be cleaned without breaking vacuum and venting the chamber.

Embodiments described herein will be discussed with reference to a PVD chamber. A suitable PVD chamber that may be used to practice the embodiments described herein is the ENDURA® Aluminum PVD chamber, the ALPS® Plus, and SIP ENCORE® available from Applied Materials, Inc., of Santa Clara, Calif. It is to be understood that other chambers may be used, including those available from other manufacturers.

Figure 1:
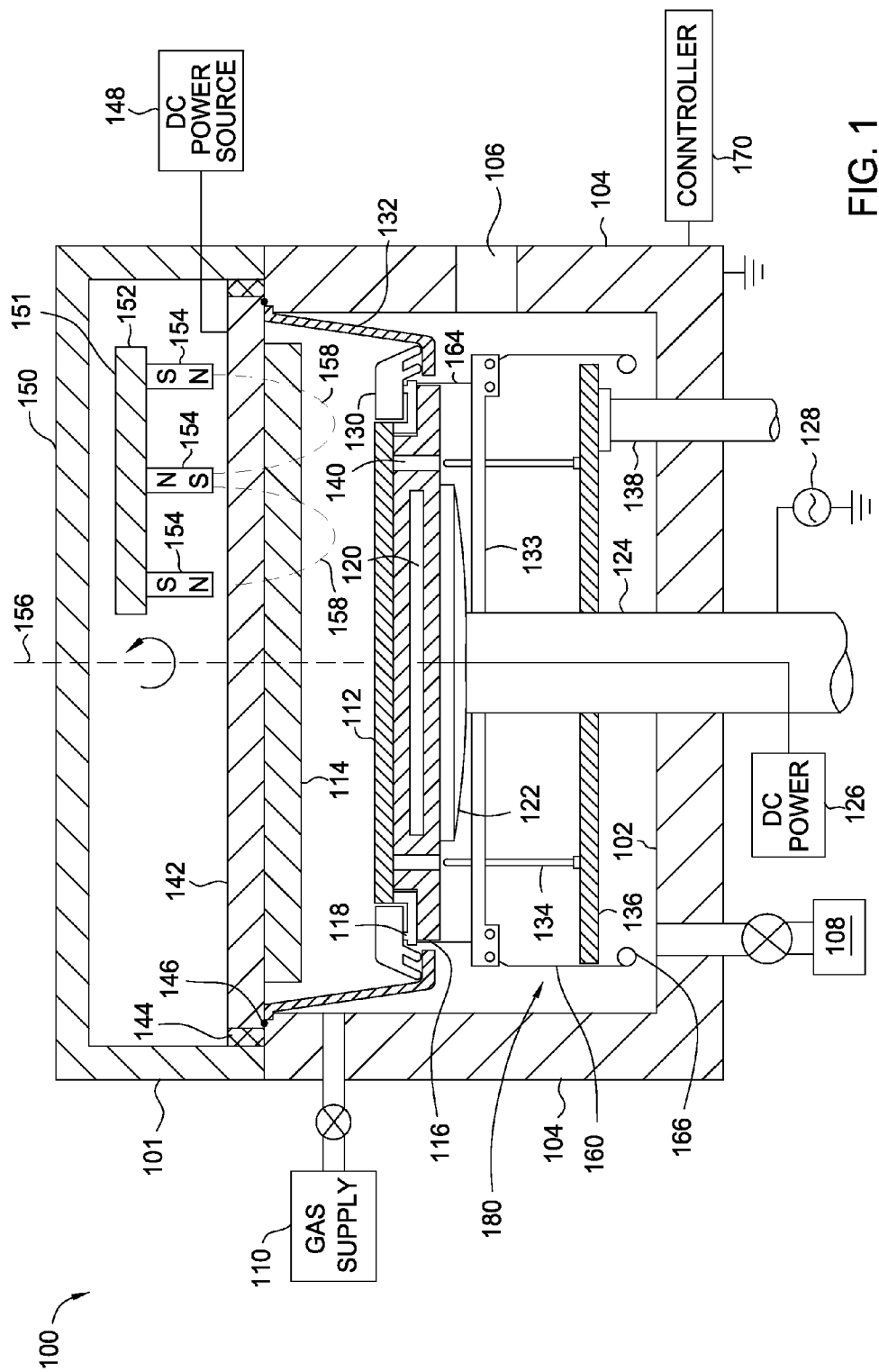
FIG. 1 is a schematic view of a PVD chamber according to one embodiment described herein.

FIG. 1 is a schematic cross sectional view of a PVD chamber 100 according to one embodiment described herein. The chamber 100 includes a chamber body 101 having a chamber bottom 102 and a plurality of chamber walls 104. One or more slit valve openings 106 may be present through one or more chamber walls 104. The slit valve opening 106 permits a substrate 112 to enter and exit the chamber 100. The chamber 100 may be evacuated by a vacuum pump 108. Processing gas may be introduced into the chamber 100 from a gas source 110.

The substrate 112 may rest on a susceptor 116 opposite to a sputtering target 114. In one embodiment, the susceptor 116 comprises a ceramic material. The susceptor 116 may have an electrode 120 embedded therein that is coupled to a DC power source 126. During processing, the susceptor 116 acts as an anode in opposition to the sputtering target 114 that is electrically biased by a DC power source 148 and functions as a cathode. In one embodiment, the susceptor 116 may simply be coupled to ground. The susceptor 116 may be supported by a susceptor base 122. The susceptor base 122 is coupled by a shaft 124 to a lift mechanism (not shown). The shaft 124 and susceptor base 122 may lower the susceptor 116 to a transfer position to allow the substrate 112 entering the chamber 100 to be placed on the susceptor 116. The shaft 124 and susceptor base 122 may raise the susceptor 116 to a processing position proximate the target 114. A deposition ring 118 circumscribes and shields the susceptor 116 from unwanted deposition. An RF power source 128 may also be coupled to the susceptor 116.

When the substrate 112 is inserted into the chamber 100 through the slit valve opening 106, the substrate 112 is initially disposed onto lift pins 134. The lift pins 134 may be disposed on a lift pin plate 136 that is coupled by a shaft 138 to a lift mechanism (not shown). The lift pins 134 may be raised up through openings 140 in the susceptor 116 to receive the substrate 112 by actuating the plate 136 upward to displace the pins 134 relative to the susceptor 116. Thereafter, the susceptor 116 may be raised by the shaft 124 to come into contact with the substrate 112. Alternatively, the plate 136 and lift pins 134 may be lowered to lower the substrate 112 onto the susceptor 116. In one embodiment, a combination of raising the susceptor 116 and lowering the lift pins 134 and plate 136 may occur to place the substrate 112 onto the susceptor 116.

The substrate 112, after being placed onto the susceptor 116, may be raised to a processing position for material to be deposited thereon. While the substrate 112 is raised, the susceptor 116 encounters a cover ring 130 that is used to cover portions of the susceptor 116 and the deposition ring 118 where deposition is undesirable. Additionally, the cover ring 130 may reduce the amount of processing gas that flows below the susceptor 116, thereby substantially reducing unwanted deposition below the susceptor 116. The cover ring 130 is supported by the susceptor 116 when the susceptor 116 is in the processing position. When the susceptor 116 is lowered, the cover ring 130 may be transferred to and rest on a shield 132 that is disposed in the chamber 100 above the slit valve opening 106. The shield 132 covers and shadows the chamber walls 104 of the chamber 100 to reduce deposition of sputtered target material onto chamber components and surfaces behind the shield 132. A heat shield 133 is coupled with the shaft 124 and positioned below the susceptor 116.

The sputtering target 114 may be electrically biased with DC power from a power source 148. The sputtering target 114 may be bonded to a backing plate 142. In one embodiment, the power source 148 may be coupled to the backing plate 142 which couples the power to the sputtering target 114. In one embodiment, the sputtering target 114 may comprise a metal selected from the group comprising aluminum, copper, titanium, tantalum, silver, molybdenum, magnesium, and combinations thereof. In one embodiment, the backing plate 142 may comprise a material having the same electrical conductivity as the sputtering target 114. In another embodiment, the backing plate 142 may comprise a metal selected from the group comprising aluminum, copper, titanium, tantalum, silver, molybdenum, magnesium, and combinations thereof.

The backing plate 142, and hence, the sputtering target 114, may be electrically insulated from the chamber walls 104 by an electrically insulating material. In the embodiment shown in FIG. 1, the backing plate 142 is spaced from the chamber walls 104 by an electrically insulating O-ring 146.

A magnet assembly 151 may be disposed behind the sputtering target 114. The magnet assembly 151 in FIG. 1 has a magnetic yoke 152 with a plurality of permanent magnets 154 coupled thereto. In another embodiment, the magnet assembly 151 may comprise electromagnets. In the embodiment shown in FIG. 1, the magnet assembly 151 may rotate about the center axis 156 of the substrate 112, target 114, and backing plate 142. The magnet assembly 151 produces a magnetic field 158 that may increase the useful life of the sputtering target 114 by increasing the erosion uniformity of the sputtering target 114.

The magnet assembly 151 is enclosed between the backing plate 142 and a chamber lid 150 in FIG. 1. The chamber lid 150 may be coupled to the chamber walls 104 and thus be electrically grounded. However, the chamber lid 150 is electrically isolated from the electrically biased backing plate 142 and/or sputtering target 114. In the embodiment shown in FIG. 1, the lid 150 is electrically insulated from the backing plate 142 by an insulator 144.

The chamber 100 is controlled by a controller 170 that comprises program code having instruction sets to operate components of the chamber 100 to process substrates in the chamber 100. For example, the controller 170 can comprise program code that includes a substrate positioning instruction set to operate the susceptor 116; a gas flow control instruction set to operate gas flow control valves to set a flow of sputtering gas to the chamber 100; a gas pressure control instruction set to operate a throttle valve to maintain a pressure in the chamber 100; a temperature control instruction set to control a temperature control system in the susceptor 116 or chamber wall 104 to set temperatures of the substrate or chamber walls 104, respectively; a process monitoring instruction set to monitor the process in the chamber 100, and plasma cleaning instruction set to perform an in-situ plasma clean of the chamber 100 without breaking vacuum.

During the sputtering process, material from the sputtering target 114 may deposit onto the substrate 112 and any surfaces exposed to the sputtered material such as the chamber walls 104, the cover ring 130, the shield 132, and even the susceptor 116. The material may deposit onto the susceptor 116 due to material flaking from the walls 104. Additionally, if the substrate 112 is not flat against the susceptor 116 due to warping of the susceptor 116, warping of the substrate 112, or material disposed between the substrate 112 and the susceptor 116, a gap may be present between the substrate 112 and the susceptor 116 such that material entering the gap may deposit on the susceptor 116. The susceptor 116, if material deposits thereon, may not function effectively and promote additional deposits on the substrate. Thus, the susceptor 116 may be periodically cleaned.

Additionally, material from other processing chambers may enter into the chamber body as residue on substrates inserted or removed from the chamber 100. If the material is an organic residue or conductive residue and deposits on the susceptor 116, the electrostatic charge on the substrate 112 may be shielded. Thus, the substrate 112 may pop off of the susceptor 116 if too much residue is deposited onto the susceptor 116. Thus, the susceptor 116 may be periodically cleaned.

The chamber 100 also includes a process kit 180 for performing an in-situ plasma clean of the chamber 100. In one embodiment, the process kit 180 comprises the deposition ring 118, a mounting bracket 160 for coupling with the heat shield 133, one or more metallic connecting straps 164 for electrically coupling the deposition ring 118 with the heat shield 133, and a grounding loop 166 for electrically grounding the deposition ring 118.

Figure 2:
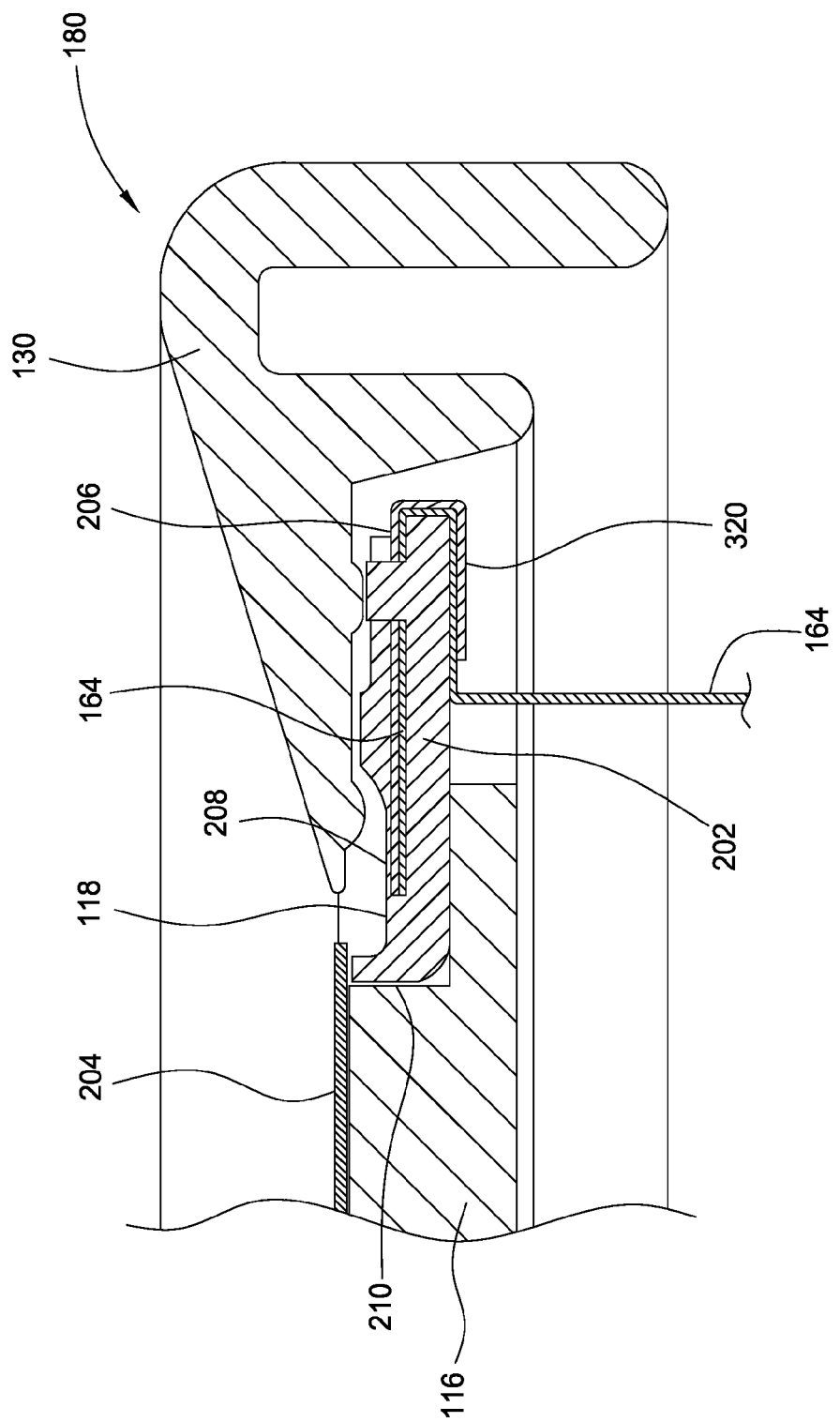
FIG. 2 is a partial sectional view of a susceptor and process kit.

FIG. 2 is a partial sectional view of the susceptor 116 and process kit 180. The deposition ring 118 works in conjunction with the cover ring 130 to reduce formation of sputter deposits on the susceptor 116 and the overhanging edge of the substrate 112. The deposition ring 118 may be fabricated from a ceramic material. The deposition ring 118 includes an annular disk 202 surrounding the susceptor 116, an inner lip 204, an outer lip 206, and a radial groove 208 formed between the inner lip 204 and the outer lip 206. The inner lip 204 extends transversely to the annular disk 202 and is substantially parallel to the peripheral sidewall 210 of the susceptor 116. The height of the inner lip 204 is less than the height of the sidewall 210 such that the inner lip 204 terminates immediately below the overhanging edge of the substrate 112. The inner lip 204 defines an inner perimeter of the deposition ring 118, which surrounds the sidewall 210 of the susceptor 116 to protect regions of the susceptor 116 that are not covered by the substrate 112 during processing. For example, the inner lip 204 surrounds and at least partially covers the peripheral sidewall 210 of the susceptor 116 that would otherwise be exposed to the processing environment, to reduce or even entirely preclude deposition of sputtering deposits on the peripheral sidewall 210. The outer lip 206 extends from the outer edge of the deposition ring 118 to the radial groove 208. Advantageously, the deposition ring 118 can be easily removed to clean sputtering deposits from the exposed surfaces of the deposition ring 118 so that the susceptor 116 does not have to be dismantled to be cleaned. The deposition ring 118 can also serve to protect the exposed side surfaces of the susceptor 116 to reduce their erosion by the energized plasma species.

Figure 3:
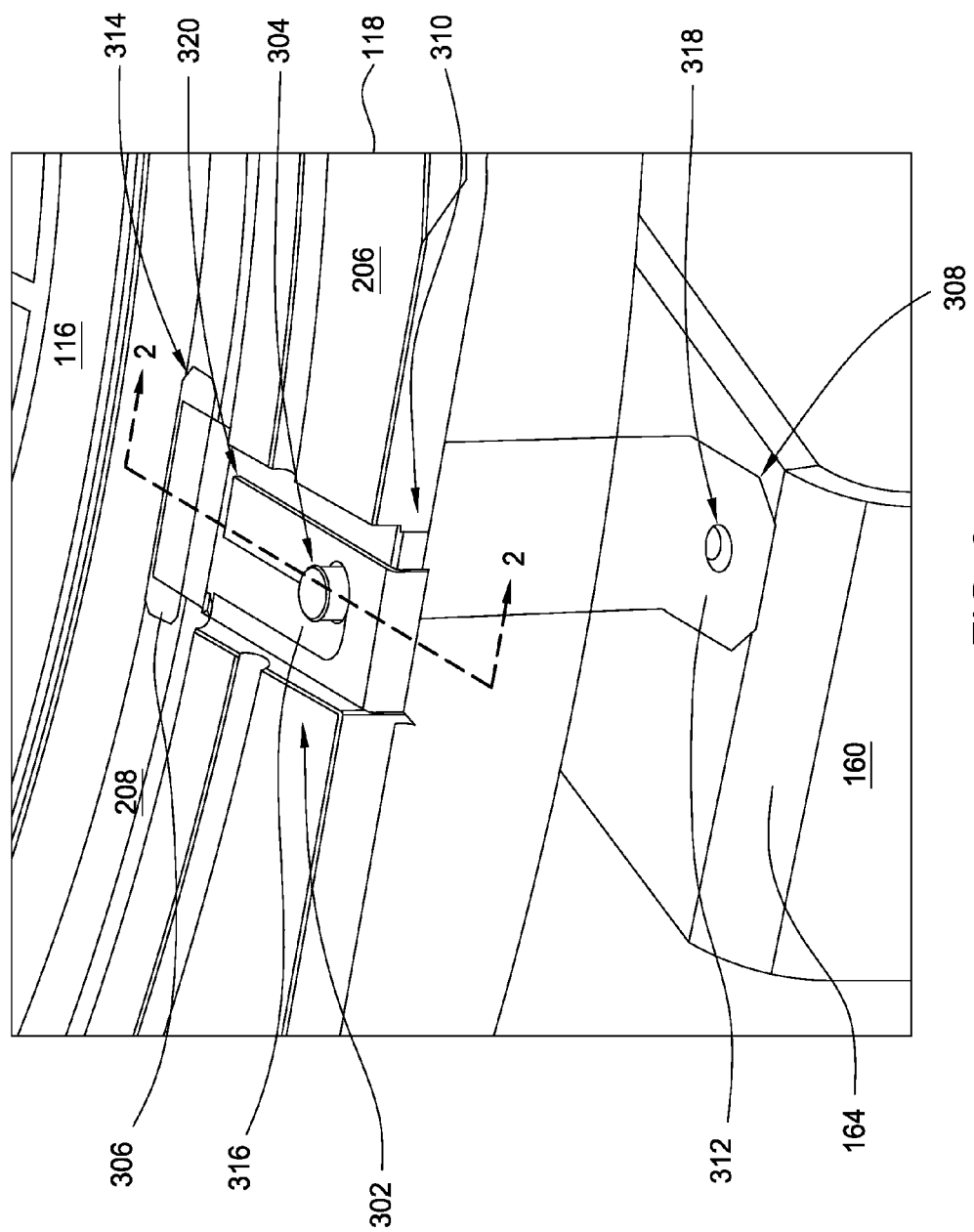
FIG. 3 is a partial perspective view of the susceptor and process kit.

FIG. 3 is a partial perspective view of the susceptor 116 and process kit 180. The annular disk 202 of the deposition ring 118 has one or more notches 302 dimensioned to accommodate the connecting straps 164. The notch 302 is formed in the outer lip 206 of the deposition ring 118 and extends from the outer lip 206 inward toward the radial groove 208. The notch 302 has a boss 304 for securing the connection strap 164.

The connection strap 164 electrically couples the deposition ring 118 and any metallic film deposited thereon to the mounting bracket 160. The connection strap 164 comprises a first end 306, a second end 308, a first bend 310 positioned adjacent to the first end 306, and a second bend 312 positioned adjacent to the second end 308. The first end 306 of the connection strap 106 which is coupled to the deposition ring 118 comprises a pair of tabs 314. When the cover ring 130 is positioned over the deposition ring 118, the tabs 314 remain exposed between the rings 130, 118 so that the metal film deposited on the deposition ring 118 during processing also deposits on and becomes electrically connected to the tabs 314. The connection strap 164 has a first hole 316 positioned between the first end 306 and the first bend 310 for accommodating the boss 304 of the deposition ring 118. The second end 308 of the connection strap 164 is coupled with the mounting bracket 160. The connection strap 164 has a second hole 318 positioned between the second bend 312 and the second end 308.

The connection strap 164 comprises a conductive flexible material such as stainless steel. In one embodiment, the connection strap 164 has a thickness between about 0.02 mm and about 0.05 mm, for example, about 0.04 mm. The connection strap 164 is generally flat prior to installation. In one embodiment, during installation, the connection strap 164 is bent down slightly along the notch 302, making sloping contact with the deposition ring 118. In one embodiment, the connection strap 164 may be preformed prior to installation. The connection strap 164 may be secured to the deposition ring 118 using a clip 320 such as an L-shaped clip. The clip 320 may be used to secure the connection strap 164 to the notch 302 of the deposition ring 118.

Figure 4:
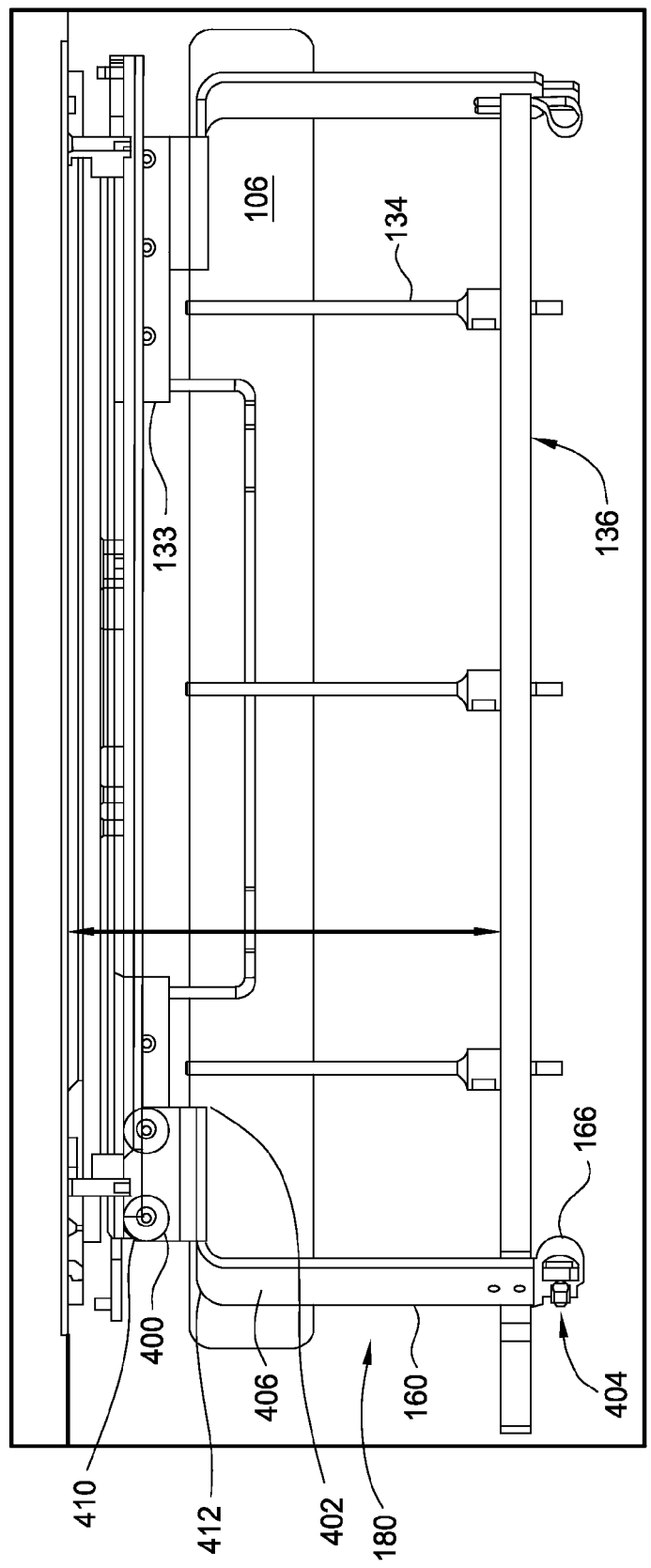
FIG. 4 is another partial schematic view of the susceptor and process kit.
Figure 5:
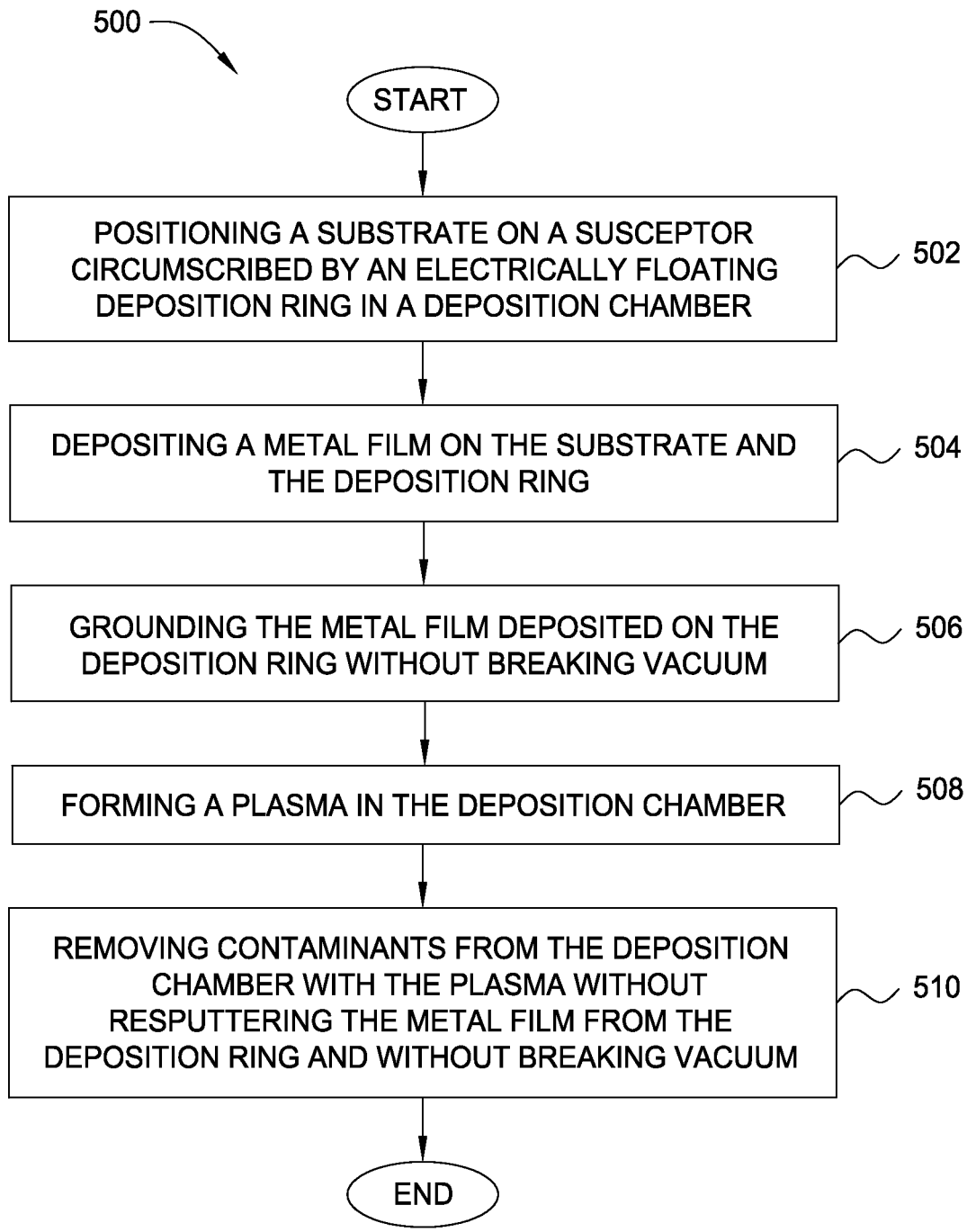
FIG. 5 is a flow chart illustrating a method for plasma cleaning of a chamber without breaking vacuum.

FIG. 4 is another partial schematic view of the susceptor 116 and process kit 180. The mounting bracket 160 includes an elbow-shaped portion 412 that electrically couples the connection strap 164 with the plate 136. As the plate 136 is grounded, the strap 164 provides a ground path from the upper surface of the deposition ring 118 and consequently the conductive materials deposited thereon. The mounting bracket 160 comprises a first end 402, a second end 404, and at least one bend 406. The first end 402 comprises a mounting flange 400 for coupling with the heat shield 133. The mounting flange 400 has at least one hole for receiving a fastener for coupling the mounting bracket 160 to the heat shield 133. As shown in FIG. 4, washers 410 comprising an insulating material, such as a ceramic material, may be used to electrically insulate the mounting bracket 160 from the heat shield 133. The second end 404 of the mounting bracket 160 is coupled with the grounding loop 166. The second end 404 of the mounting bracket 160 has at least one hole for receiving a fastener for coupling the grounding loop 166 with the mounting bracket 160. Although, in the embodiment shown, the mounting bracket 160 is coupled with the heat shield 133, it should be understood that the mounting bracket 160 may be coupled with any component that moves with the susceptor 116.

The grounding loop 166 comprises a conductive flexible material such as stainless steel. In one embodiment, the grounding loop 166 has a thickness between about 0.02 mm and about 0.05 mm, for example, about 0.04 mm. Although shown as a loop, it should be understood that any shape sufficient to make good electrical contact with a grounded portion of the chamber, such as the lift pin plate 136, is sufficient.

A method 500 for plasma cleaning of a PVD chamber 100 without breaking vacuum is provided. The method 500 begins at step 502 by positioning the substrate 112 on the susceptor 116 circumscribed by the electrically floating deposition ring 118 in the PVD chamber 100. A metal film is deposited on the substrate 112 at step 504. During step 504, melted material may also deposit on the deposition ring 118. At step 506, the metal material deposited on the deposition ring 118 is electrically grounded without breaking vacuum. At step 508, a plasma is formed in the PVD chamber 100 after the substrate is removed. At step 510, contaminants are removed from the PVD chamber 100 with the plasma without sputtering the metal film from the deposition ring 118 and without breaking vacuum.

The target 114 provides material which is deposited on the substrate 112 during a PVD process. In one embodiment, the sputtering target 114 may comprise a metal selected from the group comprising aluminum, copper, titanium, tantalum, silver, molybdenum, magnesium, and combinations thereof.

During processing, the target 114 is biased relative to ground, e.g. the chamber body 101, by the power source 148. A gas, such as argon, is supplied to the interior volume of the chamber 100 from a gas source 110. The gas source 110 may comprise a non-reactive gas such as argon or xenon, which is capable of energetically impinging upon and sputtering material from the target 114. The gas source 110 may also include a reactive gas, such as one or more of an oxygen-containing gas, a nitrogen-containing gas, a methane-containing gas, that are capable of reacting with the sputtering material to form a layer on a substrate. Spent process gas and byproducts are exhausted from the chamber 100 using vacuum pump 108. Typically, the pressure of the sputtering gas in the chamber 100 is set to sub-atmospheric levels, such as a vacuum environment, for example, gas pressures of 0.6 mTorr to 400 mTorr. The plasma is formed from the gas between the substrate 112 and the target 114. Ions within the plasma are accelerated toward the target 114 and cause material to become dislodged from the target 114. The dislodged target material is deposited on the substrate 112 and the deposition ring 118.

In one embodiment, after completion of the deposition process, the substrate 112 is removed from the chamber 100 prior to commencement of the in-situ cleaning process.

The metal film deposited on the deposition ring 118 is electrically grounded without breaking vacuum using the process kit 180 described herein. Electrical contact is established between the connection strap 164 and the metal film on the deposition ring 118 when sufficient metal material has been deposited on the tabs 314 of the strap exposed on top of the deposition ring 118. Initially, upon installation of a new deposition ring, there is no electrical connection between the deposition ring 118 which comprises a ceramic material and the connection strap 164 which comprises a metallic material. For example, a sufficient electrical connection may be established after 0.5 mm of metal film has been deposited on the deposition ring 118 while in contact with the tabs 314. Prior to electrical grounding of the metal film on the deposition ring 118, the apparatus 100 is reconfigured from a processing position to a cleaning position. When in the processing position, the lift pin plate 136 is positioned such that the grounding loop 166 does not contact the lift pin plate 136. The embodiment shown in FIG. 4 provides an example of the processing position where the grounding loop 166 is not touching the lift pin plate 136. The grounding loop 166 may be separated from the lift pin plate 136 by moving the lift pin plate 136 vertically upward relative to the susceptor 116, moving the susceptor 116 vertically downward relative to the lift pin plate 136, or moving both the susceptor 116 and the lift pin plate 136 relative to each other such that the deposition ring 118 remains electrically floating. When in the cleaning position, the lift pin plate 136 is positioned such that the grounding loop 166 contacts the lift pin plate 136 effectively electrically grounding the metal film deposited on the deposition ring 118. The cleaning position can be achieved by moving the lift pin plate 136 vertically upward relative to the susceptor 116, moving the susceptor 116 vertically downward relative to the lift pin plate 136, or moving both the susceptor 116 and the lift pin plate 136 relative to each other such that the grounding loop 166 contacts the lift pin plate 136 effectively grounding the metal film on the deposition ring 118. The resiliency of the grounding loop 166 allows greater tolerance of the vertical position of the susceptor 116 while maintaining the conductive path to ground.

During a cleaning process, the susceptor 116 may be electrically biased with an RF current from a power source 148 and cleaning gas is introduced into the chamber 100 from a gas source 110. Suitable cleaning gases may include oxygen-containing or fluorine containing gases, such as $O_2$, $C_2F_5H$, $F_2$, $NF_3$, $CF_4$, $C_3F_8$, or $SF_6$, and combinations thereof, and optionally, carrier gases, such as argon. The RF current applied to the ceramic susceptor 116 generates a plasma from the cleaning gas within the chamber 100. Various frequencies may be used, such as a frequency between about 0.3 MHz and about 200 MHz. In one embodiment, the RF current is provided at a frequency of 13.56 MHz. The magnetic field 158 generated by the magnet assembly 151 may confine a portion of the plasma within an area near the center of the susceptor 116. The plasma sputter etches the susceptor 116 to remove undesired material. Additionally, other components of the chamber 100 may be cleaned. Contaminants are removed from the PVD chamber 100 with the plasma without resputtering the metal film from the deposition ring 118 without breaking vacuum.

Although the plasma clean is discussed as an in-situ plasma clean, it should also be understood that the plasma may be supplied from a remote plasma source and supplied to the chamber 100. Examples of a remote plasma clean source and process are disclosed in U.S. Pat. No. 5,788,778, issued Aug. 4, 1998, titled DEPOSITION CHAMBER CLEANING TECHNIQUE USING A HIGH POWER REMOTE EXCITATION SOURCE.

While the foregoing is directed to embodiments of the present invention, other and further embodiments of the invention may be devised without departing from the basic scope thereof, and the scope thereof is determined by the claims that follow.

The invention claimed is:

1. A physical vapor deposition (PVD) chamber, comprising:
 a chamber body having a chamber bottom and chamber walls;
 a sputtering target for depositing sputtered material onto a substrate;
 a susceptor disposed generally parallel to and opposite the sputtering target for supporting the substrate, wherein the susceptor is movable between a processing position and a cleaning position;
 an electrically floating deposition ring positioned on the susceptor and encircling a peripheral wall of the susceptor, wherein the deposition ring is isolated from the chamber body;
 a grounded lift-pin plate positioned below the susceptor;
 a metallic connecting strap coupled to the deposition ring for electrically coupling metallic films deposited on the deposition ring with the grounded lift-pin plate; and
 a grounding loop electrically coupled with the metallic connecting strap, the grounding loop contacting the grounded lift-pin plate when the susceptor is in the cleaning position and spaced from the grounded lift-pin plate when the susceptor is in the processing position.

2. The chamber of claim 1, further comprising:
 a heat shield positioned between the susceptor and the grounded lift-pin plate; and
 a mounting bracket coupled to the heat shield, wherein the metallic connecting strap is coupled to a first end of the mounting bracket and the grounding loop is coupled to a second end of the mounting bracket.

3. The chamber of claim 2, further comprising ceramic washers electrically isolating the mounting bracket from the heat shield.

4. The chamber of claim 2, further comprising:
 a gas supply for introducing a gas into the chamber; and
 a gas exhaust for exhausting gas from the chamber.

5. The chamber of claim 1, wherein the electrically floating deposition ring has a boss extending from a top surface and the metallic connecting strap has a hole for accepting the boss, wherein an end of the metallic connecting strap is exposed on top of the deposition ring radially inward of the boss.

6. The chamber of claim 1, wherein the deposition ring comprises:
 an annular disk surrounding the susceptor;
 an inner lip extending transversely to the annular disk and defining an inner perimeter of the deposition ring; and
 an outer lip, wherein a radial groove is located between the inner lip and the outer lip, and the outer lip extends from an outer edge of the deposition ring to the radial groove.

7. The chamber of claim 5, wherein the deposition ring has a notch including the boss, wherein the notch is configured to accommodate the metallic connecting strap.

8. The chamber of claim 7, wherein the notch is formed in the outer lip and extends from the outer lip inward toward the radial groove.

9. The chamber of claim 1, wherein the deposition ring is fabricated from ceramic material.

10. The chamber of claim 1, wherein the metallic connecting strap comprises:
 a first end;
 a second end;
 a first bend positioned adjacent to the first end; and
 a second bend positioned adjacent to the second end, wherein the metallic connection strap has a first hole positioned between the first end and the first bend for accommodating the boss of the deposition ring and a second hole positioned between the second bend and the second end.

11. A physical vapor deposition (PVD) chamber, comprising:
 a chamber body having a chamber bottom and chamber walls;
 a sputtering target for depositing sputtered material onto a substrate;
 a susceptor disposed generally parallel to and opposite the sputtering target for supporting the substrate, wherein the susceptor is movable between a processing position and a cleaning position;
 an electrically floating ceramic deposition ring positioned on the susceptor and encircling a peripheral wall of the susceptor, wherein the ceramic deposition ring is isolated from the chamber body and comprises:
  an annular disk surrounding the susceptor;
  an inner lip extending transversely to the annular disk and defining an inner perimeter of the ceramic deposition ring; and
  an outer lip, wherein a radial groove is located between the inner lip and the outer lip, and the outer lip extends from an outer edge of the ceramic deposition ring to the radial groove;
 a grounded lift-pin plate positioned below the susceptor;
 a metallic connecting strap coupled to the ceramic deposition ring for electrically coupling metallic films deposited on the ceramic deposition ring with the grounded lift-pin plate; and
 a grounding loop electrically coupled with the metallic connecting strap, the grounding loop contacting the grounded lift-pin plate when the susceptor is in the cleaning position and spaced from the grounded lift-pin plate when the susceptor is in the processing position.

12. The chamber of claim 11, further comprising:
a heat shield positioned between the susceptor and the grounded lift-pin plate; and
a mounting bracket coupled to the heat shield, wherein the metallic connecting strap is coupled to a first end of the mounting bracket and the grounding loop is coupled to a second end of the mounting bracket.

13. The chamber of claim 12, further comprising ceramic washers electrically isolating the mounting bracket from the heat shield.

14. The chamber of claim 12, further comprising:
a gas supply for introducing a gas into the chamber; and
a gas exhaust for exhausting gas from the chamber.

15. The chamber of claim 11, wherein the electrically floating ceramic deposition ring has a boss extending from a top surface of the annular disk and the metallic connecting strap has a hole for accepting the boss, wherein an end of the strap is exposed on top of the ceramic deposition ring radially inward of the boss.

16. The chamber of claim 15, wherein the ceramic deposition ring has a notch including the boss, wherein the notch is configured to accommodate the metallic connecting strap.

17. The chamber of claim 16, wherein the notch is formed in the outer lip and extends from the outer lip inward toward the radial groove.

18. The chamber of claim 11, wherein the metallic connecting strap comprises:
a first end;
a second end;
a first bend positioned adjacent to the first end; and
a second bend positioned adjacent to the second end, wherein the metallic connection strap has a first hole positioned between the first end and the first bend for accommodating the boss of the ceramic deposition ring and a second hole positioned between the second bend and the second end.

19. The chamber of claim 11, further comprising a shield encircling the sputtering target and shadowing the chamber walls.

20. The chamber of claim 1, further comprising a shield encircling the sputtering target and shadowing the chamber walls.

* * * * *